(12) United States Patent
Song et al.

(10) Patent No.: US 11,621,672 B2
(45) Date of Patent: Apr. 4, 2023

(54) COMPENSATION OF TRAPPING IN FIELD EFFECT TRANSISTORS

(71) Applicant: Wolfspeed, Inc., Durham, NC (US)

(72) Inventors: Young-Youl Song, Gilroy, CA (US); Zulhazmi A. Mokhti, Morgan Hill, CA (US); John Wood, Raleigh, NC (US); Qianli Mu, San Jose, CA (US); Jeremy Fisher, Raleigh, NC (US)

(73) Assignee: Wolfspeed, Inc., Durham, NC (US)

( * ) Notice: Subject to any disclaimer, the term of this patent is extended or adjusted under 35 U.S.C. 154(b) by 0 days.

(21) Appl. No.: 17/395,035

(22) Filed: Aug. 5, 2021

(65) Prior Publication Data
US 2023/0040260 A1    Feb. 9, 2023

(51) Int. Cl.
*H03F 1/30* (2006.01)
*H03F 1/02* (2006.01)
*H01L 29/778* (2006.01)
*H01L 29/20* (2006.01)
*H01L 23/66* (2006.01)
*H03F 3/213* (2006.01)
(Continued)

(52) U.S. Cl.
CPC ........... *H03F 1/0222* (2013.01); *H01L 23/66* (2013.01); *H01L 29/2003* (2013.01); *H01L 29/7787* (2013.01); *H03F 1/3205* (2013.01); *H03F 3/195* (2013.01); *H03F 3/213* (2013.01); *H01L 2223/665* (2013.01); *H01L 2223/6655* (2013.01); *H01L 2223/6683* (2013.01); *H03F 1/0288* (2013.01); *H03F 2200/451* (2013.01); *H03F 2200/462* (2013.01)

(58) Field of Classification Search
CPC ...... H03F 1/0222; H03F 1/0288; H03F 1/301; H03F 1/3205; H03F 3/19; H03F 3/193; H03F 3/195; H03F 3/211; H03F 3/213; H03F 3/345; H03F 3/393; H03F 2200/18; H03F 2200/451; H03F 2200/462; H03K 17/145
See application file for complete search history.

(56) References Cited

U.S. PATENT DOCUMENTS 5,986,503 A  * 11/1999  Ichikawa ................ H03F 1/306
                                                               330/296
6,849,882 B2    2/2005  Chavarkar et al.
(Continued)

OTHER PUBLICATIONS

Tomé, Pedro M. et al., "Hybrid Analog/Digital Linearization of GaN HEMT-Based Power Amplifiers," IEEE Transactions on Microwave Theory and Techniques, vol. 67, No. 1, Jan. 2019, 7 pages.
(Continued)

*Primary Examiner* — Long Nguyen
(74) *Attorney, Agent, or Firm* — Sage Patent Group

(57) ABSTRACT

A circuit includes a field effect transistor (FET), a reference transistor having an output coupled to an output of the FET, an active bias circuit coupled to the reference transistor and configured to generate an input signal for the reference transistor in response to a change in drain current of the reference transistor due to carrier trapping and to apply the input signal to an input of the reference transistor, and a summing node coupled to an input of the FET and to the input of the reference transistor. The summing node adds the input signal to an input signal of the FET to compensate the carrier trapping effect.

24 Claims, 10 Drawing Sheets

(51) Int. Cl.
    *H03F 3/195*    (2006.01)
    *H03F 1/32*     (2006.01)

(56)         References Cited

U.S. PATENT DOCUMENTS 7,126,426  B2    10/2006  Mishra et al.
    7,230,284  B2     6/2007  Parikh et al.
    7,501,669  B2     3/2009  Parikh et al.
    7,550,783  B2     6/2009  Wu et al.
    7,573,078  B2     8/2009  Wu et al.
    9,847,411  B2    12/2017  Sriram et al.
    2005/0253167  A1    11/2005  Wu et al.
    2006/0202272  A1     9/2006  Wu et al.
    2008/0128752  A1     6/2008  Wu
    2010/0276698  A1    11/2010  Moore et al.
    2012/0049973  A1     3/2012  Smith, Jr. et al.
    2012/0194276  A1     8/2012  Fisher
    2020/0235706  A1*    7/2020  Hagiwara  ............... H03F 1/301

OTHER PUBLICATIONS

Barradas, Filipe M., et al., "Compensation of Power Amplifier Long-Term Memory Behavior for Pulsed Radar Applications," IEEE Transactions on Microwave Theory and Techniques, vol. 67, No. 12, Dec. 2019, 8 pages.
Cope, Mark, "Charge Trapping Effects in GaN Research and Development," Analog Devices, Inc., Wireless Systems Group, Jun. 2019, 22 pages.

* cited by examiner

COMPENSATION OF TRAPPING IN FIELD EFFECT TRANSISTORS

BACKGROUND

The present disclosure relates to transistor structures and in particular to high electron mobility transistors.

Narrow bandgap semiconductor materials, such as silicon (Si) and gallium arsenide (GaAs), are widely used in semiconductor devices for low power and, in the case of Si, low frequency applications. However, these semiconductor materials may not be well-suited for high power and/or high frequency applications, for example, due to their relatively small bandgaps (1.12 eV for Si and 1.42 for GaAs at room temperature) and relatively small breakdown voltages.

Interest in high power, high temperature and/or high frequency applications and devices has focused on wide bandgap semiconductor materials such as silicon carbide (3.2 eV for 4H-SiC at room temperature) and the Group III nitrides (e.g., 3.36 eV for GaN at room temperature). These materials may have higher electric field breakdown strengths and higher electron saturation velocities than GaAs and Si.

A device of particular interest for high power and/or high frequency applications is the High Electron Mobility Transistor (HEMT), which is also known as a modulation doped field effect transistor (MODFET). In a HEMT device, a two-dimensional electron gas (2DEG) may be formed at the heterojunction of two semiconductor materials with different bandgap energies, where the smaller bandgap material has a higher electron affinity than the wider bandgap material. The 2DEG is an accumulation layer in the undoped smaller bandgap material and can contain a relatively high sheet electron concentration, for example, in excess of $10^{13}$ carriers/cm$^2$. Additionally, electrons that originate in the wider bandgap semiconductor may transfer to the 2DEG, allowing a relatively high electron mobility due to reduced ionized impurity scattering. This combination of relatively high carrier concentration and carrier mobility can give the HEMT a relatively large transconductance and may provide a performance advantage over metal-semiconductor field effect transistors (MESFETS) for high-frequency applications.

HEMTs fabricated in the gallium nitride/aluminum gallium nitride (GaN/AlGaN) material system can generate large amounts of RF power due to a combination of material characteristics, such as relatively high breakdown fields, relatively wide bandgaps, relatively large conduction band offset, and/or relatively high saturated electron drift velocity. A major portion of the electrons in the 2DEG may be attributed to polarization in the AlGaN.

FIG. 1A illustrates a conventional gallium nitride-based HEMT structure. The structure includes a substrate 10, which may be a semi-insulating 4H silicon carbide (SiC) substrate. Optional buffer, nucleation and/or transition layers (not shown) may be provided on the substrate 10. A channel layer 20 is provided on the substrate 10. The channel layer 20 may be a Group III-nitride, such as GaN. A barrier layer 22 is provided on the channel layer 20. The barrier layer 22 has a bandgap that is greater than the bandgap of the channel layer 20 and the channel layer 20 may have a larger electron affinity than the barrier layer 22. The barrier layer 22 may be AlN, AlInN, AlGaN or AlInGaN, and is thick enough and has a high enough Al composition and doping to induce a significant carrier concentration at the interface between the channel layer 20 and the barrier layer 22. This induced carrier concentration forms a two dimensional electron gas (2DEG) which provides a conductive channel in the device.

The conductivity of the 2DEG channel can be modulated by applying a voltage to a gate contact 32 formed on the barrier layer 22.

FIG. 1A also illustrates a cap layer 24 on the barrier layer 22 with the gate contact 32 in a recess 36 through the cap layer 24. The cap layer 24 moves the top (outer) surface of the device physically away from the channel, which may reduce surface effects of the device. The cap layer 24 may be blanket formed on the barrier layer 22 and may be epitaxially grown and/or formed by deposition. Typically, the cap layer 24 may have a thickness of from about 2 nm to about 500 nm.

As is further illustrated in FIG. 1A, ohmic source/drain contacts 30 are provided on the barrier layer 22, and a gate recess is provided through the cap layer 24 to expose a portion of the barrier layer 22. A gate contact 32 is formed in the recess and contacts the exposed portion of the barrier layer 22. The gate contact 32 may be a "T" gate as illustrated in FIG. 1A.

Trapped charges in semiconductor devices, such as GaN HEMT devices, can cause non-linear distortion in output signals generated by transistor amplifiers that use the devices. Although not wishing to be bound by a particular theory, it is presently believed that charges may be injected into the barrier and/or channel layer of a HEMT device from the gate contact of the device, and that such charges may become trapped in the barrier and/or channel layer. These trapped charges may cause long-term memory effects in the device, resulting in highly nonlinear behavior.

Some efforts to address the carrier trapping behavior of GaN-based HEMT devices have been attempted. For example, FIG. 1B illustrates an open-loop analog feedforward circuit for the compensation of long-term memory effects due to self-biasing caused by electron trapping in GaN HEMT-based power amplifiers. The circuit includes an envelope detector that detects an envelope of the RF input signal. The envelope is rectified and the rectified envelope is provided to an R-C network that acts as an electron trapping model to generate a compensation signal that is added to the gate bias voltage $V_{GG}$ that is applied to the HEMT of the amplifier.

Although the concept of trap compensation by gate modulation has been demonstrated in principle, existing approaches have some limitations. For example, existing approaches use open loop techniques that cannot detect dynamic trap behavior. Rather, the existing approaches assume that the trapping behavior of the device only depends on the waveform applied to the device, and that the relationship between the trapping behavior and the input waveform is fixed, which is not necessarily the case in practical applications.

SUMMARY

A circuit according to some embodiments includes a field effect transistor (FET), a reference transistor having an output coupled to an output of the FET, an active bias circuit coupled to the reference transistor and configured to generate an input signal for the reference transistor in response to a drain current of the reference transistor and to apply the input signal to an input of the reference transistor, and a summing node coupled to an input of the FET and to the input of the reference transistor, wherein the summing node adds the input signal to an input signal of the FET.

The drain terminal of the FET may be RF-coupled to the drain terminal of the reference transistor through a coupling capacitor. The circuit may further include an RF shunt capacitor between the gate terminal of the reference transistor and ground. The gate terminal of the reference transistor may be DC coupled to the gate terminal of the FET.

In some embodiments, the circuit may further include a buffer between the gate terminal of the reference transistor and the gate terminal of the FET. The buffer may include an operational amplifier circuit having a voltage follower configuration.

The circuit may further include a low pass filter between the gate of the reference transistor and the gate of the FET.

In some embodiments, the circuit may further include a drain current monitor circuit configured to detect a level of drain current flowing in the reference transistor, wherein the drain current monitor circuit is coupled to the active bias circuit.

The circuit may further include a low pass filter between the reference transistor and the drain current monitor circuit.

The reference transistor and the FET may include Group III-nitride based high electron mobility transistors. In some embodiments, the reference circuit and the FET may be formed on a single substrate and share a common epitaxial structure.

The reference transistor and the FET may be biased with a common drain bias voltage.

In some embodiments, the active bias circuit may be configured to control a gate voltage of the reference transistor to maintain a constant drain current through the reference transistor. The active bias circuit may be configured to generate the input signal to generate an input signal for the reference transistor in response to a change in the drain current of the reference transistor that is caused by carrier trapping in the reference transistor.

A transistor amplifier according to some embodiments includes a power field effect transistor, FET, having a source terminal, a drain terminal and a gate terminal, a reference transistor having a source terminal, a drain terminal and a gate terminal, an RF coupling capacitor connected between the drain terminal of the reference transistor and the drain terminal of the power FET, a drain current detection circuit coupled to the drain terminal of the reference transistor and configured to detect a change in a drain current of the reference transistor, and an active bias circuit coupled to the drain current detection circuit and configured to generate an input signal for the reference transistor in response to the change in the drain current of the reference transistor. The input signal is applied to the gate of the reference transistor, and the input signal is added to an RF input signal of the power FET.

The reference transistor and the power FET may be biased for Class A operation or a reduced conduction angle bias, such as Class AB operation.

The transistor amplifier may further include an RF shunt capacitor between the gate terminal of the reference transistor and ground. The gate terminal of the reference transistor may be DC coupled to the gate terminal of the power FET.

In some embodiments, the transistor amplifier may further include a buffer between the gate terminal of the reference transistor and the gate terminal of the power FET. The buffer may include an operational amplifier circuit having a voltage follower configuration.

The transistor amplifier may further include a low pass filter between the gate of the reference transistor and the gate of the power FET.

A method according to some embodiments of compensating trapping effects in a field effect transistor (FET) includes detecting a change in drain current of a reference transistor that is coupled to the FET, generating an input signal for the reference transistor in response to the change in the drain current of the reference transistor, applying the input signal to an input of the reference transistor, and adding the input signal as a compensation signal to an RF input signal of the FET.

DETAILED DESCRIPTION OF EMBODIMENTS

Figure 1A:
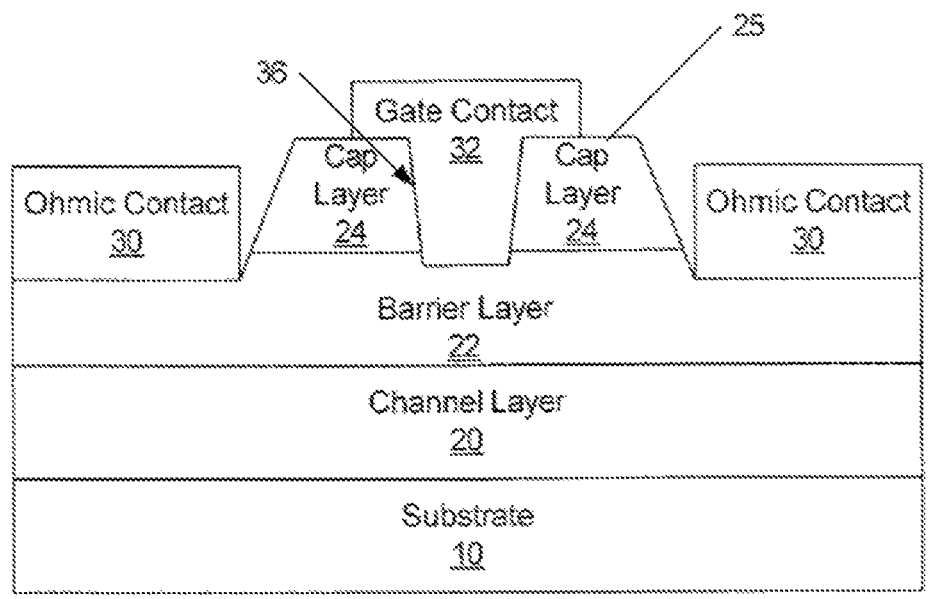
FIG. 1A is a cross-sectional view of a conventional transistor device.
Figure 1B:
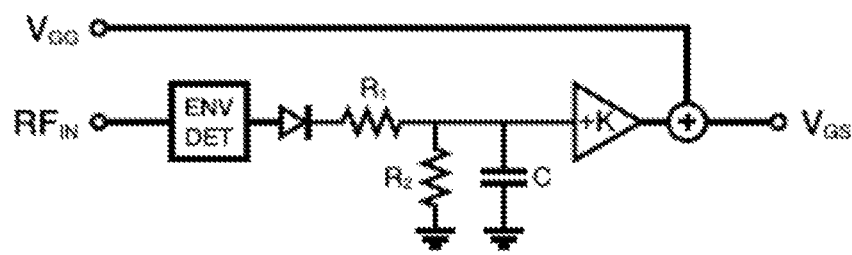
FIG. 1B is a conventional open-loop circuit for compensating carrier trapping effects in a transistor device.

Embodiments of the inventive concepts will now be described in connection with the accompanying drawings. Some embodiments described herein provide a transistor device including a field plate that is self-aligned the gate, and in some embodiments that is laterally spaced apart from the gate, such that the field plate does not overlap the gate in the vertical direction. In some embodiments, the field plate is recessed toward the barrier layer in a recess region. In still further embodiments, the field plate may be connected to the source outside an active area of the device by means of a connection that does not cross over the gate of the device.

It is also understood that, although the ordinal terms first, second, third, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Furthermore, relative terms, such as "lower" or "bottom" and "upper" or "top," may be used herein to describe the relationship of one element to another as illustrated in the drawings. It is understood that relative terms are intended to encompass different orientations of the device in addition to the orientation depicted in the drawings. For example, if the device in one of the drawings is turned over, features described as being on the "lower" side of an element would then be oriented on "upper" side of that element. The exemplary term "lower" can therefore describe both lower and upper orientations, depending of the particular orientation of the device. Similarly, if the device in one of the drawings is turned over, elements described as "below" or "beneath" other elements would then be oriented above those other elements. The exemplary terms "below" or "beneath" can therefore describe both an orientation of above and below.

The terminology used in the description of the disclosure herein is for the purpose of describing particular embodiments only and is not intended to be limiting of the disclosure. As used in the description of the disclosure and the appended claims, the singular forms "an" and "the" are intended to include the plural forms as well, unless the context clearly indicates otherwise. It is also understood that the term "and/or" as used herein refers to and encompasses any and all possible combinations of one or more of the associated listed items. It will be further understood that the terms "comprises" and "comprising," when used in this specification, specify the presence of stated steps, operations, features, elements, and/or components, but do not preclude the presence or addition of one or more other steps, operations, features, elements, components, and/or groups thereof.

Embodiments of the disclosure are described herein with reference to cross-section illustrations that are schematic illustrations of idealized embodiments of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. The regions illustrated in the drawings are schematic in nature, and their shapes are not intended to illustrate the actual shape of a region of a device and are not intended to limit the scope of the disclosure unless explicitly stated otherwise. Further, lines that appear straight, horizontal, or vertical in the below drawings for schematic reasons will often be sloped, curved, non-horizontal, or non-vertical. Further, while the thicknesses of elements are meant to be schematic in nature.

Unless otherwise defined, all terms used in disclosing embodiments of the disclosure, including technical and scientific terms, have the same meaning as commonly understood by one of ordinary skill in the pertinent art and are not necessarily limited to the specific definitions known at the time of the present disclosure. Accordingly, these terms can include equivalent terms that are created after such time. It is further understood that terms, such as those defined in commonly used dictionaries, should be interpreted as having a meaning that is consistent with their meaning in the present specification and in the context of the relevant art.

As noted above, existing approaches for addressing trapping compensation in Group III-nitride HEMT-based transistor amplifiers use open loop techniques that cannot detect dynamic trap behaviors. Some embodiments described herein provide a closed-loop solution that detects trapping effects in a reference transistor and compensates trapping effects in a power transistor based on the detected trapping effects.

In particular, some embodiments provide an analog closed loop circuit that directly tracks the complex and random trapping behaviors that may be experienced in a Group III-nitride HEMT transistor, and generates a corresponding compensation signal that is applied to the gate of the transistor. In this approach, the gate bias voltage is corrected based on changes in trapping behavior during operation without simply tracking the input waveform.

Figure 2:
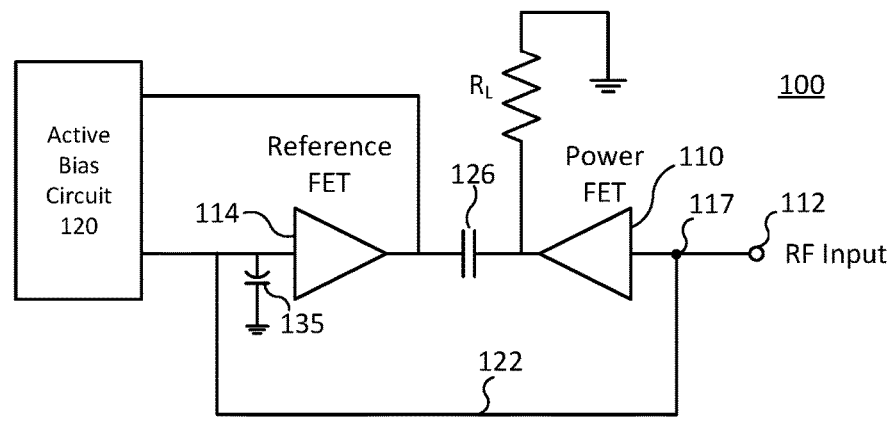
FIGS. 2 and 3 are schematic diagrams of a closed-loop circuit for compensating carrier trapping effects in a transistor device according to some embodiments.
Figure 3:
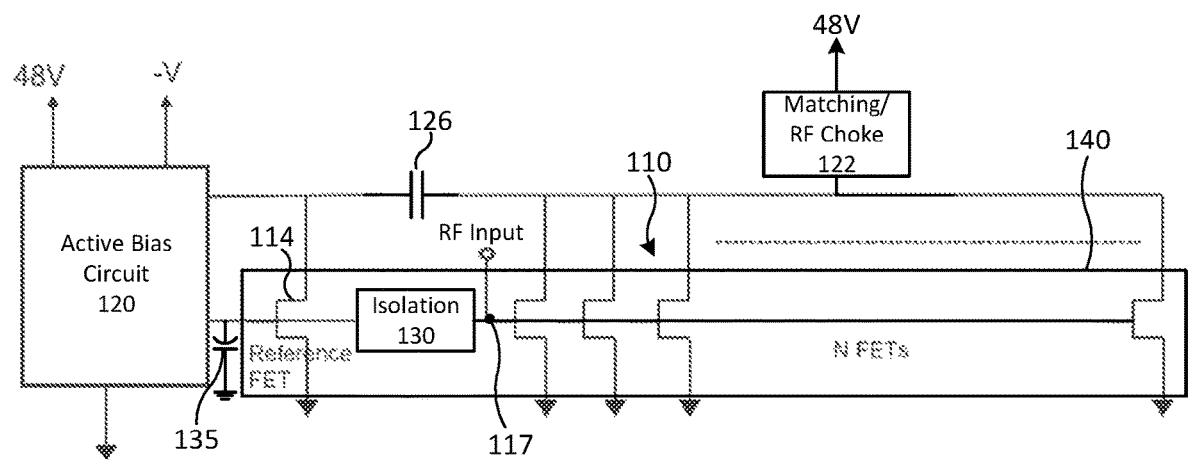

FIGS. 2 and 3 are schematic diagrams of a closed-loop circuit for compensating carrier trapping effects in a transistor device according to some embodiments. Referring to FIGS. 2 and 3, a circuit 100 for compensating trapping effects according to some embodiments is illustrated in schematic. The circuit 100 includes a power field effect transistor (FET) 110 that receives an RF input signal at an RF input node 112. The power FET 110 amplifies the RF input signal and outputs an amplified output signal to a load $R_L$.

A reference FET 114 is provided for trap monitoring and compensation. The reference FET 114 is biased substantially the same as the power FET 110 to ensure that it experiences the same or similar trapping characteristics as the power FET. In some embodiments, the reference FET 114 and the power FET 110 may be formed on a common substrate using the same epitaxial structure to ensure similar trapping behavior in both devices. In some embodiments, the circuit 100 may be fabricated as a monolithic microwave integrated circuit (MMIC), as discussed in more detail below. Both the reference FET 114 and the power FET 110 may include Group III-nitride based HEMT devices.

The output (drain) of the main power FET 110 is RF coupled to the output (drain) of the reference FET 114 via a coupling capacitor 126 to ensure that the reference FET 114 and the power FET 110 have the same or similar drain lag.

The circuit 100 monitors drain current variations in the reference FET 114 that represent the effect of carrier trapping in the FET. A signal representing the drain current variation is input to an active bias circuit 120 that generates a compensation signal that is applied to the gate of the power FET 110.

The active bias circuit 120 generates and applies a compensation signal to the input (gate) of the reference FET 114 to maintain the drain current at a constant level, which compensates the trapping effect. The input (gate) of the reference FET 114 is DC coupled to the input (gate) of the power FET 110 via a summing node 117 so that the power FET 110 receives the same compensation signal to thereby compensate the trapping effect inside the power FET 110.

Referring to FIG. 3, the power FET 110 may comprise a plurality of unit cells connected in parallel, while the reference FET 114 may comprise fewer unit cells than the power FET 110. In some embodiments, the reference FET 114 may comprise a single unit cell. The gate inputs of the reference FET 114 and the power FET 110 may be DC coupled through an isolation circuit 130, such as a buffer or voltage follower circuit. A drain bias voltage (e.g., 48V) may be applied to the power FET 110 via a matching and RF choke network 122. A similar drain bias voltage may be applied to the reference FET 114.

In some embodiments, the gate of the reference FET 114 may be RF shorted to attenuate drain current modulation due to the input waveform that may otherwise contaminate the drain current modulation due to carrier trapping.

By providing a closed loop trapping compensation circuit, the circuit 100 may track the effects of carrier trapping in the power FET 110 and compensate for such effects by applying a compensation signal to the gate of the power FET 110 during device operation.

Figure 4:
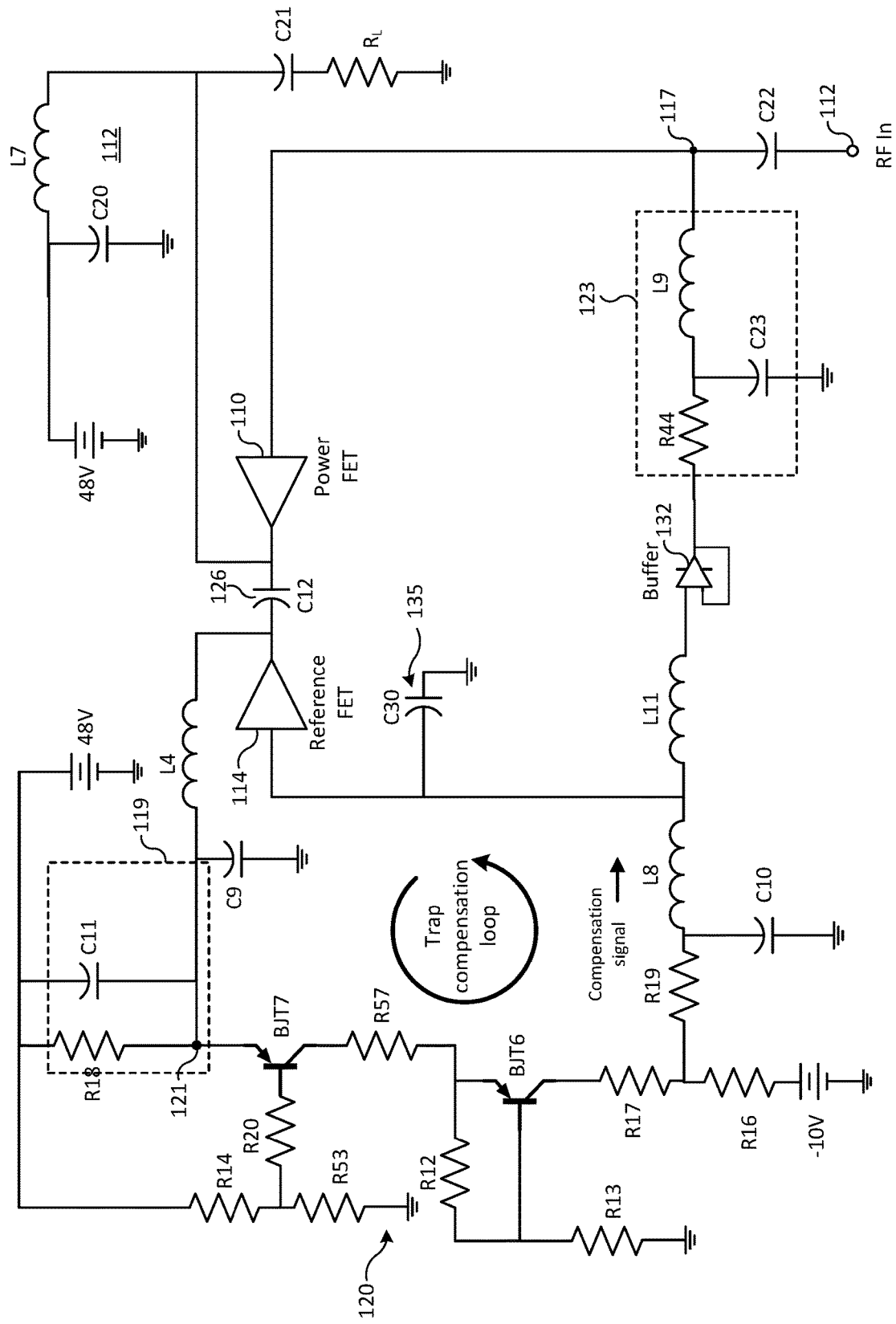
FIG. 4 is a circuit diagram of a closed-loop circuit for compensating carrier trapping effects in a transistor device according to some embodiments.

FIG. 4 is a detailed schematic circuit diagram of a closed-loop circuit 100 for compensating carrier trapping effects in a transistor device according to some embodiments. Referring to FIG. 4, the circuit 100 includes a power FET 110 that receives an RF input signal at an RF input node 112. The power FET 110 amplifies the RF input signal and outputs an amplified output signal from an output (drain) node of the power FET 110 to a load $R_L$ that is connected through a DC blocking capacitor C21. The drain of the power FET 110 is biased by a matching/RF choke network 122.

A reference FET 114 is provided, and the output (drain) of the power FET 110 is RF coupled to the output (drain) of the reference FET 114 via a coupling capacitor C12 126 to ensure that the reference FET 114 and the power FET 110 have the same or similar drain lag. The reference FET 114 is biased through a drain current detection circuit 119 including a resistor R18 and a capacitor C11 in parallel between the bias voltage and the drain. A low pass filter including a capacitor C9 and an inductor L4 is provided between the drain of the reference FET 114 and the drain current detection circuit 119 to filter RF energy from the input of the drain current detector circuit 119, which may limit the impact of the output RF waveform on the compensation circuit. A voltage proportional to the drain current appears at node 121 and is input to an active bias circuit 120.

Figure 8:
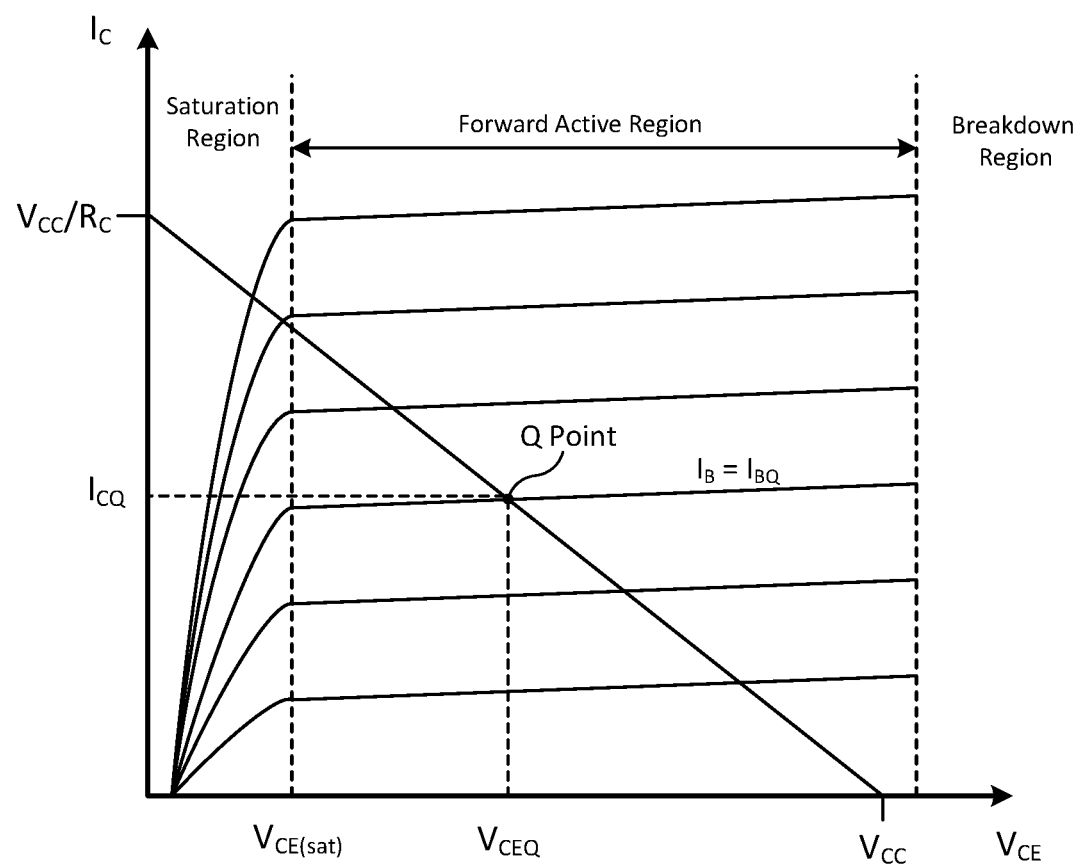
FIG. 8 is an I-V plot of a transistor in an active bias circuit of a circuit according to some embodiments.

The design of active bias circuits for control of FETs is known in the art. In the embodiment illustrated in FIG. 4, the active bias circuit includes resistors R14, R20, R53, R12, R13, R17 and R16, and PNP transistors BJT7 and BJT6. However, the active bias circuit may have any suitable topology. Referring briefly to FIG. 8, which is an I-V plot of the PNP transistor BJT7, operation of the active bias circuit 120 is as follows. The voltage across R18 is set to a constant by the voltage divider consisting of R14 and R53. The current through R18 is a constant. When the drain current Idq of the reference FET 114 decreases due to trapping, a higher collector current Ic will flow through BJT7. The operating point of BJT7 then shifts to the left in the I-V plot of FIG. 8, resulting in a smaller collector-emitter voltage Vce in BJT7 and a higher gate voltage on the reference FET 114. The drain current Idq of the reference FET 114 increases back to complete the closed loop. BJT6 is used in place of a resistor to manage the current level of BJT7 to avoid cutoff.

Referring again to FIG. 4, a compensation signal is output by the active bias circuit and filtered by a low pass filter including resistor R19, capacitor C10 and inductor L8 to attenuate residual RF energy. The compensation signal is provided to the input (gate) of the reference FET 114 maintain the drain current at a constant level, thereby compensating for changes in the drain current of the reference FET 114.

This forms a closed trap compensation loop as shown in FIG. 4, which allows the circuit 100 to monitor and adjust for drain current variations in the reference FET 114 that represent the effect of carrier trapping in the FET 114.

The compensation signal provided to the input (gate) of the reference FET 114 is also provided to the input (gate) of the power FET 110. In particular, the input (gate) of the reference FET 114 is DC coupled to the input (gate) of the power FET 110 and added to the RF input signal that is input to the power FET 110 at a summing node 117. The input (gate) of the reference FET 114 is coupled to the summing node 117 through a DC coupling path that may optionally include an RF choke inductor L11 and/or a low pass filter 123 including a resistor R44, an inductor L9 and a capacitor C23 as shown in FIG. 4. Isolation between the inputs of the reference FET 114 and the power FET 110 may be provided by a buffer circuit 132. In particular, the buffer circuit 132 may be implemented using an operational amplifier configured as a voltage follower as illustrated in FIG. 4.

In some embodiments, the input (gate) of the reference FET 114 may be RF shorted via an RF short network 135 including shunt capacitor C30 to attenuate drain current modulation due to the input waveform that may otherwise contaminate the drain current modulation due to carrier trapping.

Because the power FET 110 receives the same compensation signal as the reference FET 114, trapping effects in the power FET 110 are compensated.

Example values for the circuit elements shown in FIG. 4 are given in Table 1, below.

TABLE 1

Example Circuit Element Values

| Element | Value | Unit |
| --- | --- | --- |
| C9 | 10 | pF |
| C10 | 10 | pF |
| C11 | 10 | pF |
| C20 | 1000 | pF |
| C21 | 10 | pF |
| C22 | 10 | pF |
| C23 | 10 | pF |
| C30 | 10 | µF |
| C12/126 | 10 | pF |
| L4 | 10 | nH |
| L7 | 10 | nH |
| L8 | 10 | nH |
| L9 | 10 | nH |
| L11 | 10 | nH |
| R12 | 499 | Ω |
| R13 | 10 | kΩ |
| R14 | 470 | Ω |
| R16 | 1.8 | kΩ |
| R17 | 2.2 | kΩ |
| R18 | 470 | Ω |
| R19 | 10 | Ω |
| R20 | 22 | Ω |
| R44 | 10 | Ω |
| R53 | 10 | kΩ |
| R57 | 0 | Ω |

Figure 5A:
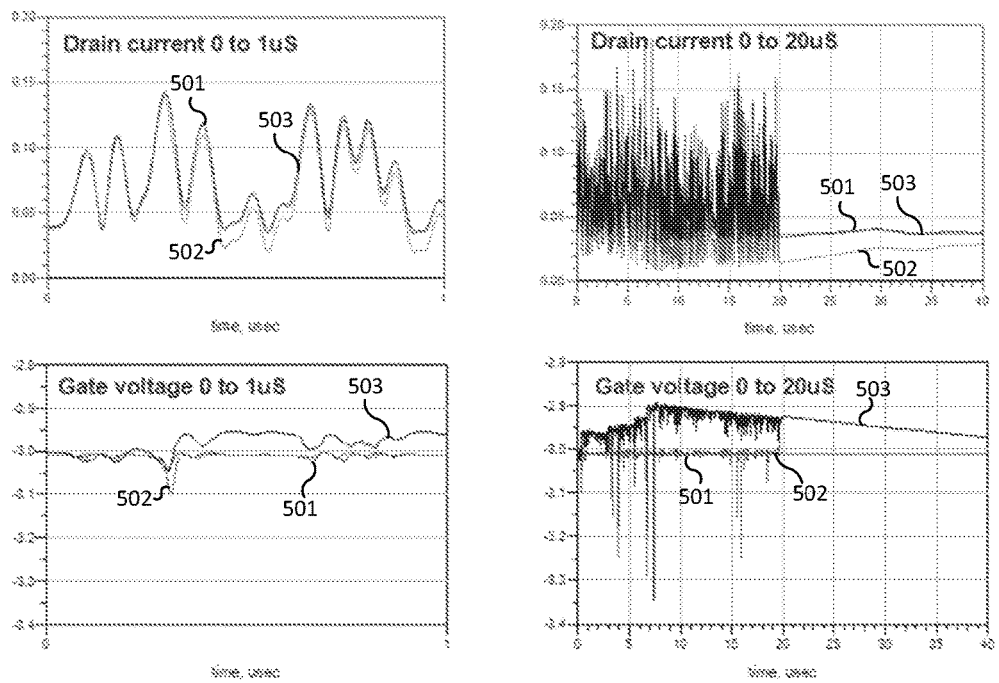
FIG. 5A is a graph of simulation results showing gate voltage and drain current of transistor devices with and without trapping compensation.

FIG. 5A is a graph of simulation results showing gate voltage and drain current of transistor devices with and without trapping compensation. In particular, drain current is plotted on the upper two graphs of FIG. 5A for 1 µs (left) and 20 µs (right) and gate voltage is plotted on the lower two graphs of FIG. 5A for 1 µs (left) and 20 µs (right) for three different conditions.

To obtain the simulation results of FIG. 5A, the circuit of FIG. 4 was simulated using a GaN HEMT model for the reference FET 114 having a gate width of 0.05 mm and Idq of 1 mA (110 mA/mm) and a GaN HEMT model for the power FET having a gate width of 3.6 mm and Idq of 36 mA (10 mA/mm). The reference FET 114 and power FET 110 are biased for operation in a reduce conduction angle bias, such as Class AB mode.

In FIG. 5A, curves 501 represent results for a model with no trapping and no trapping compensation, curves 502 represent results for a model with trapping and no trapping compensation, and curves 503 represent results for a model with trapping and trapping compensation by closed loop gate modulation according to some embodiments. As can be seen in FIG. 5A, when trapping compensation is performed according to some embodiments (curve 503), the drain current is almost identical to the simulation results for a model with no trapping (curve 501). The effect of trapping compensation can be seen in the graphs of gate voltage, where the gate voltage in the case where trapping compensation is performed diverges substantially from the gate voltages when no trapping compensation is performed (curves 501 and 502)

Figure 5B:
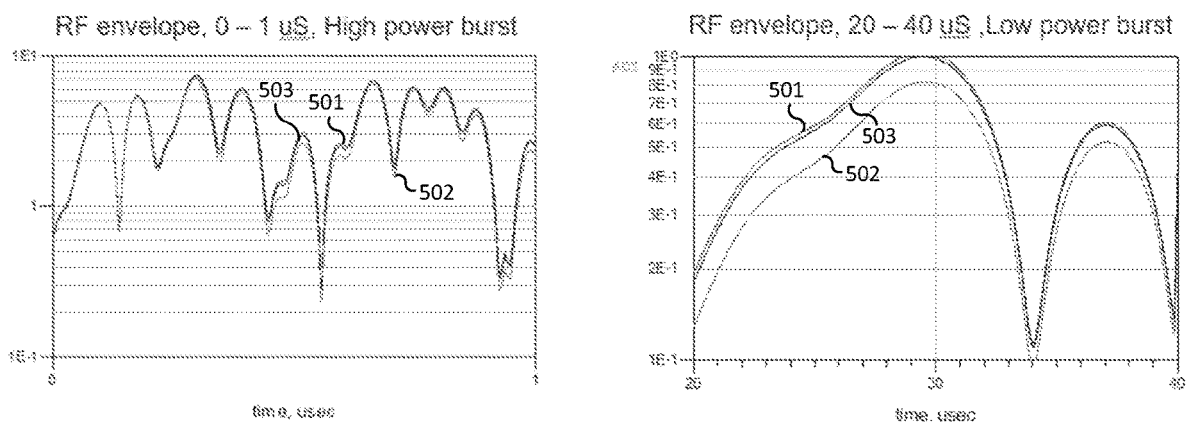
FIG. 5B is a graph of simulation results showing RF envelopes for transistor devices with and without trapping compensation.

FIG. 5B is a graph of simulation results from the simulation used to generate FIG. 5A showing RF envelopes for transistor devices with and without trapping compensation for 1 µs (left) and 40 µs (right). As in FIG. 5A, curves 501 represent results for a model with no trapping and no trapping compensation, curves 502 represent results for a model with trapping and no trapping compensation, and curves 503 represent results for a model with trapping and trapping compensation by closed loop gate modulation according to some embodiments. The RF envelope for the simulation with trapping compensation (curve 503) is very close to the curve with no trapping (curve 501) and substantially different from the curve with trapping and no compensation (curve 502).

From these results, it is clear that the trap effect is being compensated in the power FET 110.

Figure 6:
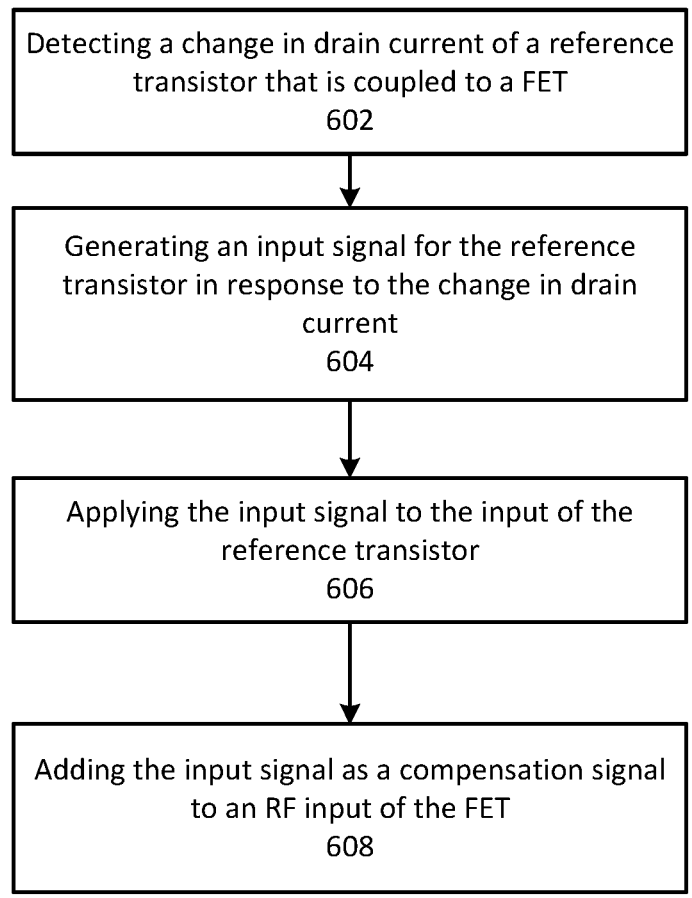
FIG. 6 is a flowchart illustrating operations of compensating trapping effects in a transistor device according to some embodiments.

FIG. 6 is a flowchart illustrating operations of compensating trapping effects in a transistor device according to some embodiments. Referring to FIG. 6, a method of compensating trapping effects in a field effect transistor (FET) includes detecting a change in drain current of a reference transistor that is coupled to the FET (block 602), generating an input signal for the reference transistor in response to the change in the drain current of the reference transistor (block 604), applying the input signal to an input of the reference transistor (block 606), and adding the input signal as a compensation signal to an RF input signal of the FET (block 608).

Figure 7:
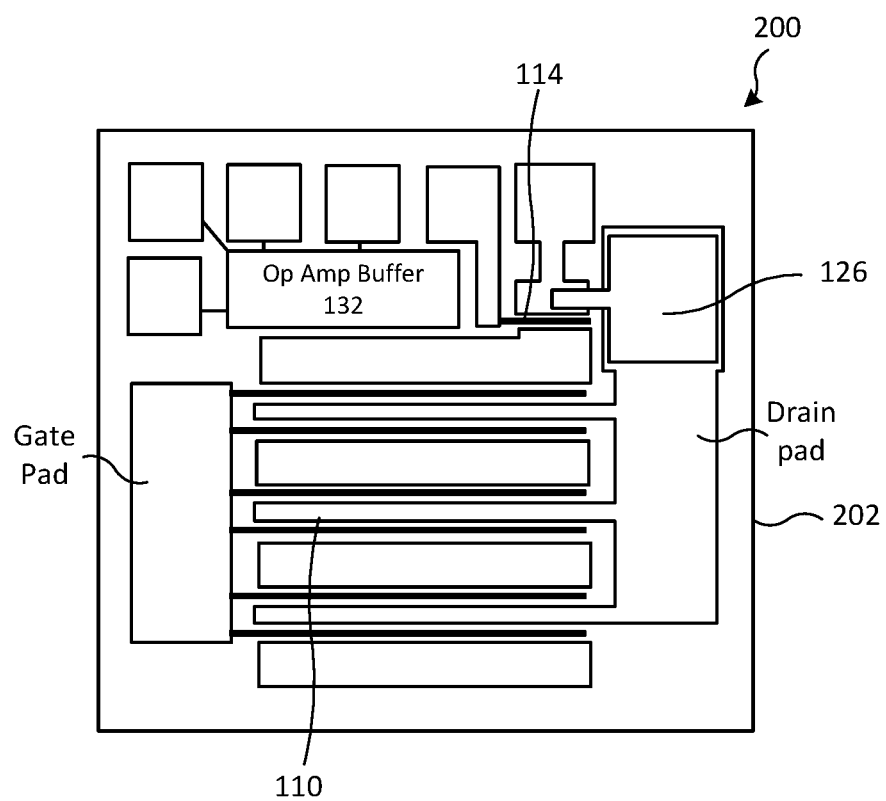
FIG. 7 is a schematic diagram illustrating a layout of a monolithic integrated circuit including a power transistor device and a circuit for compensating trapping effects in the power transistor device according to some embodiments.

FIG. 7 is a schematic diagram illustrating a layout of a monolithic microwave integrated circuit (MMIC) 200 including a power FET 110, and a circuit for compensating trapping effects in the power FET 110 including a reference FET 114 and a buffer circuit 132 according to some embodiments. In particular, the power FET 110 and the reference FET 114 may be formed on a common substrate 202 and have identical epitaxial structures. Gate pads and drain pads are provided on the MMIC 200 for both the power FET 110 and the reference FET 114, as well as for an operational amplifier used to implement the buffer circuit 132. The coupling capacitor 126 is provided between drains of the power FET 110 and the reference FET 114.

Transistor devices including circuits for compensating trapping effects as described herein may be used in amplifiers that operate in a wide variety of different frequency bands. In some embodiments, the RF transistor amplifiers incorporating transistor devices as described herein may be configured to operate at frequencies greater than 1 GHz. In other embodiments, the RF transistor amplifiers may be configured to operate at frequencies greater than 2.5 GHz. In still other embodiments, the RF transistor amplifiers may be configured to operate at frequencies greater than 3.1 GHz. In yet additional embodiments, the RF transistor amplifiers may be configured to operate at frequencies greater than 5 GHz. In some embodiments, the RF transistor amplifiers may be configured to operate in at least one of the 2.5-2.7 GHz, 3.4-4.2 GHz, 5.1-5.8 GHz, 12-18 GHz, 18-27 GHz, 27-40 GHz or 40-75 GHz frequency bands or sub-portions thereof.

Although embodiments of the inventive concepts have been discussed above with respect to HEMT devices, it will be understood that the inventive concepts described herein may be applied to other types of semiconductor devices, such as MOSFETs, DMOS transistors, and/or laterally diffused MOS (LDMOS) transistors.

RF transistor amplifiers incorporating transistor devices described herein can be used in standalone RF transistor amplifiers and/or in multiple RF transistor amplifiers. Examples of how the RF transistor amplifiers according to some embodiments may be used in applications that include multiple amplifiers will be discussed with reference to FIGS. 9A-9C.

Figure 9A:
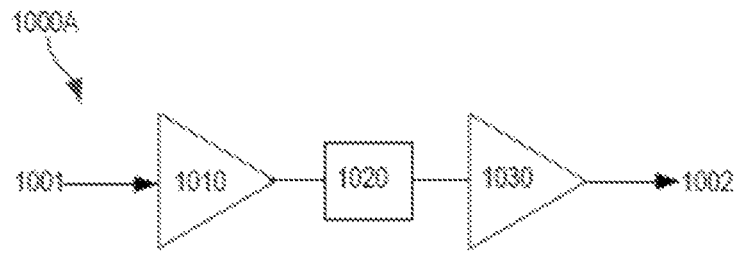
FIGS. 9A, 9B and 9C are schematic block diagrams of multi-amplifier circuits in which RF transistor amplifiers incorporating transistor devices according to embodiments may be used.

Referring to FIG. 9A, an RF transistor amplifier 1000A is schematically illustrated that includes a pre-amplifier 1010 and a main amplifier 1030 that are electrically connected in series. As shown in FIG. 9A, RF transistor amplifier 1000A includes an RF input 1001, the pre-amplifier 1010, an inter-stage impedance matching network 1020, the main amplifier 1030, and an RF output 1002. The inter-stage impedance matching network 1020 may include, for example, inductors and/or capacitors arranged in any appropriate configuration in order to form a circuit that improves the impedance match between the output of pre-amplifier 1010 and the input of main amplifier 1030. While not shown in FIG. 9A, RF transistor amplifier 1000A may further include an input matching network that is interposed between RF input 1001 and pre-amplifier 1010, and/or an output matching network that is interposed between the main amplifier 1030 and the RF output 1002. The RF transistor amplifiers according to embodiments may be used to implement either or both of the pre-amplifier 1010 and the main amplifier 1030.

Figure 9B:
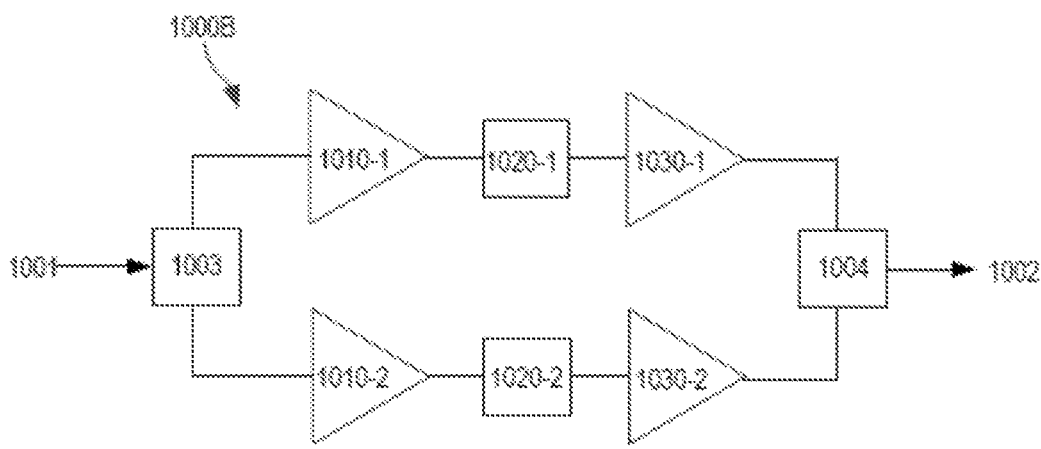

Referring to FIG. 9B, an RF transistor amplifier 1000B is schematically illustrated that includes an RF input 1001, a pair of pre-amplifiers 1010-1, 1010-2, a pair of inter-stage impedance matching networks 1020-1, 1020-2, a pair of main amplifiers 1030-1, 1030-2, and an RF output 1002. A splitter 1003 and a combiner 1004 are also provided. Pre-amplifier 1010-1 and main amplifier 1030-1 (which are electrically connected in series) are arranged electrically in parallel with pre-amplifier 1010-2 and main amplifier 1030-2 (which are electrically connected in series). As with the RF transistor amplifier 1000A of FIG. 9A, RF transistor amplifier 1000B may further include an input matching network that is interposed between RF input 1001 and pre-amplifiers 1010-1, 1010-2, and/or an output matching network that is interposed between the main amplifiers 1030-1, 1030-2 and the RF output 1002.

Figure 9C:
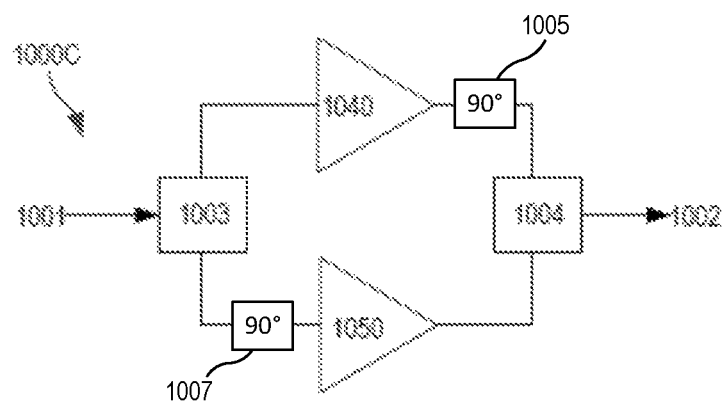

As shown in FIG. 9C, the RF transistor amplifiers according to some embodiments may also be used to implement Doherty amplifiers. As is known in the art, a Doherty amplifier circuit includes first and second (or more) power-combined amplifiers. The first amplifier is referred to as the "main" or "carrier" amplifier and the second amplifier is referred to as the "peaking" amplifier. The two amplifiers may be biased differently. For example, the main amplifier may comprise a Class AB or a Class B amplifier while the peaking amplifier may be a Class C amplifier in one common Doherty amplifier implementation. The Doherty amplifier may operate more efficiently than balanced amplifiers when operating at power levels that are backed off from saturation. An RF signal input to a Doherty amplifier is split (e.g., using a quadrature coupler), and the outputs of the two amplifiers are combined. The main amplifier is configured to turn on first (i.e., at lower input power levels) and hence only the main amplifier will operate at lower power levels. As the input power level is increased towards saturation, the peaking amplifier turns on and the input RF signal is split between the main and peaking amplifiers.

As shown in FIG. 9C, the Doherty RF transistor amplifier 1000C includes an RF input 1001, an input splitter 1003, a main amplifier 1040, a peaking amplifier 1050, an output combiner 1004 and an RF output 1002. The Doherty RF transistor amplifier 1000C includes a 90° transformer 1007 at the input of the peaking amplifier 1050 and a 90° transformer 1005 at the input of the main amplifier 1040, and may optionally include input matching networks and/or an output matching networks (not shown). The main amplifier 1040 and/or the peaking amplifier 1050 may be implemented using any of the above-described RF transistor amplifiers according to embodiments.

The RF transistor amplifiers according to embodiments may be formed as discrete devices, or may be formed as part of a Monolithic Microwave Integrated Circuit (MMIC). A MMIC refers to an integrated circuit that operates on radio and/or microwave frequency signals in which all of the circuitry for a particular function is integrated into a single semiconductor chip. An example MMIC device is a transistor amplifier that includes associated matching circuits, feed networks and the like that are all implemented on a common substrate. MMIC transistor amplifiers typically include a plurality of unit cell HEMT transistors that are connected in parallel.

Figure 10:
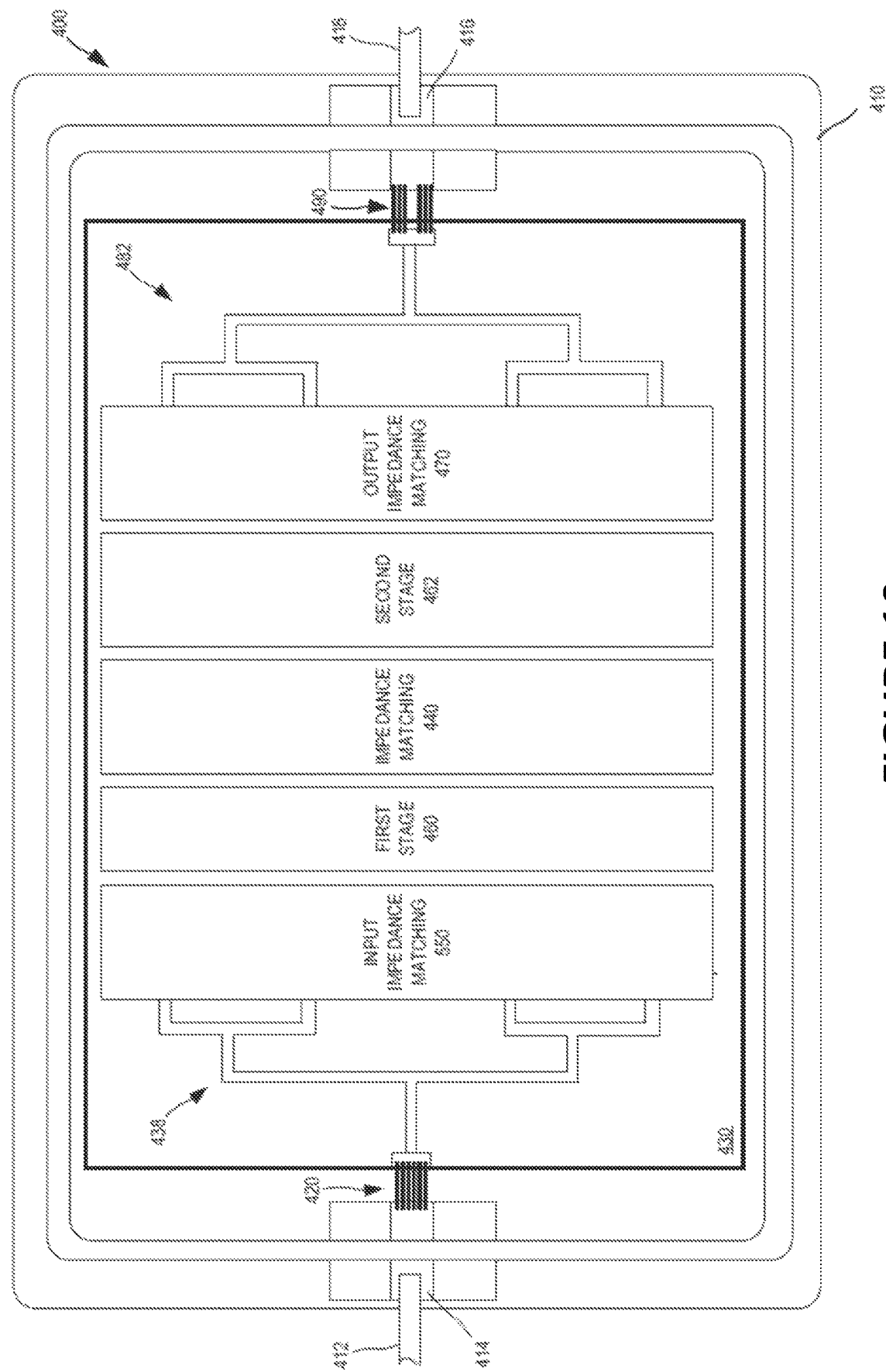
FIG. 10 is a schematic illustration of a MMIC amplifier including a HEMT transistor according to some embodiments.

FIG. 10 is a plan view of a MMIC RF transistor amplifier 400 according to embodiments of the present inventive concepts. As shown in FIG. 10, the MMIC RF transistor amplifier 400 includes an integrated circuit chip 430 that is contained within a package 410. The package 410 may comprise a protective housing that surrounds and protects the integrated circuit chip 430. The package 410 may be formed of, for example, a ceramic material.

The package 410 includes an input lead 412 and an output lead 418. The input lead 412 may be mounted to an input lead pad 414 by, for example, soldering. One or more input bond wires 420 may electrically connect the input lead pad 414 to an input bond pad on the integrated circuit chip 430. The integrated circuit chip 430 includes an input feed network 438, an input impedance matching network 450, a first RF transistor amplifier stage 460, an intermediate impedance matching network 440, a second RF transistor amplifier stage 462, an output impedance matching stage 470, and an output feed network 482.

The package 410 further includes an output lead 418 that is connected to an output lead pad 416 by, for example, soldering. One or more output bond wires 490 may electrically connect the output lead pad 416 to an output bond pad on the integrated circuit chip 430. The first RF transistor amplifier stage 460 and/or the second RF transistor amplifier stage 462 may be implemented using any of the RF transistor amplifiers according to embodiments of the present inventive concepts.

The RF transistor amplifiers according to embodiments of the present inventive concepts may be designed to operate in a wide variety of different frequency bands. In some embodiments, these RF transistor amplifier dies may be configured to operate in at least one of the 0.6-2.7 GHz, 3.4-4.2 GHz, 5.1-5.8 GHz, 12-18 GHz, 18-27 GHz, 27-40 GHz or 40-75 GHz frequency bands or sub-portions thereof. The techniques according to embodiments of the present inventive concepts may be particularly advantageous for RF transistor amplifiers that operate at frequencies of 10 GHz and higher.

Figure 11A:
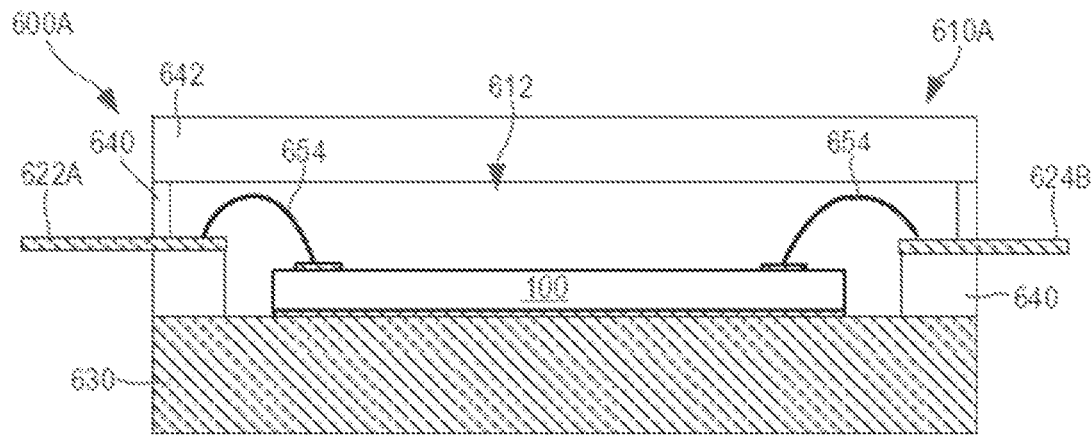
FIGS. 11A and 11B are schematic cross-sectional views illustrating example packages for RF transistor amplifier dies according to some embodiments.
Figure 11B:
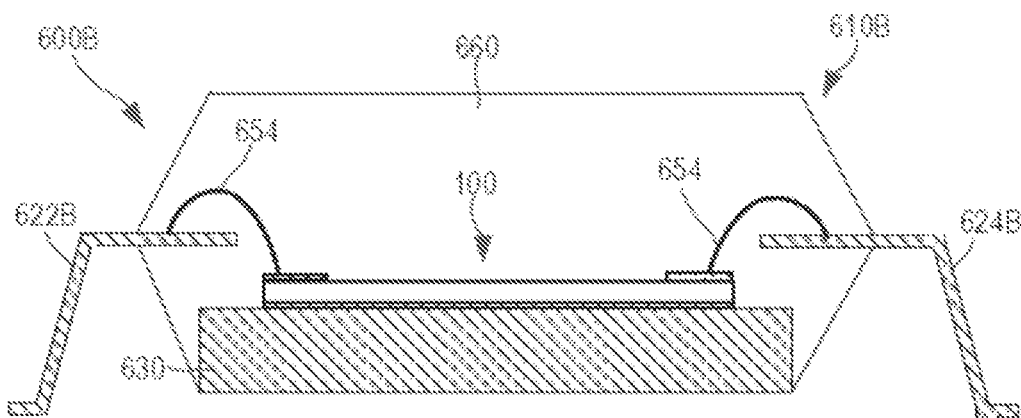

FIGS. 11A and 11B are schematic cross-sectional views illustrating several example ways that that the RF transistor amplifier dies according to embodiments of the present inventive concepts may be packaged to provide packaged RF transistor amplifiers 600A and 600B, respectively.

FIG. 11A is a schematic side view of a packaged Group III nitride-based RF transistor amplifier 600A. As shown in FIG. 11A, packaged RF transistor amplifier 600A includes the RF transistor amplifier die 100 packaged in an open cavity package 610A. The package 610A includes metal gate leads 622A, metal drain leads 624A, a metal submount 630, sidewalls 640 and a lid 642.

The submount 630 may include materials configured to assist with the thermal management of the package 600A. For example, the submount 630 may include copper and/or molybdenum. In some embodiments, the submount 630 may be composed of multiple layers and/or contain vias/interconnects. In an example embodiment, the submount 630 may be a multilayer copper/molybdenum/copper metal flange that comprises a core molybdenum layer with copper cladding layers on either major surface thereof. In some embodiments, the submount 630 may include a metal heat sink that is part of a lead frame or metal slug. The sidewalls 640 and/or lid 642 may be formed of or include an insulating material in some embodiments. For example, the sidewalls 640 and/or lid 642 may be formed of or include ceramic materials.

In some embodiments, the sidewalls 640 and/or lid 642 may be formed of, for example, Al2O3. The lid 642 may be glued to the sidewalls 640 using an epoxy glue. The sidewalls 640 may be attached to the submount 630 via, for example, braising. The gate lead 622A and the drain lead 624A may be configured to extend through the sidewalls 640, though embodiments of the present inventive concepts are not limited thereto.

The RF transistor amplifier die 100 is mounted on the upper surface of the metal submount 630 in an air-filled cavity 612 defined by the metal submount 630, the ceramic sidewalls 640 and the ceramic lid 642. The gate and drain terminals of RF transistor amplifier die 100 may be on the top side of the structure, while the source terminal is on the bottom side of the structure.

The gate lead 622A may be connected to the gate terminal of RF transistor amplifier die 100 by one or more bond wires 654. Similarly, the drain lead 624A may be connected to the drain terminal of RF transistor amplifier die 100 by one or more bond wires 654. The source terminal may be mounted on the metal submount 630 using, for example, a conductive die attach material (not shown). The metal submount 630 may provide the electrical connection to the source terminal 126 and may also serve as a heat dissipation structure that dissipates heat that is generated in the RF transistor amplifier die 100.

The heat is primarily generated in the upper portion of the RF transistor amplifier die 100 where relatively high current densities are generated in, for example, the channel regions of the unit cell transistors. This heat may be transferred though the source vias 146 and the semiconductor layer structure of the device to the source terminal and then to the metal submount 630.

FIG. 11B is a schematic side view of another packaged Group III nitride based RF transistor amplifier 600B. RF transistor amplifier 600B differs from RF transistor amplifier 600A in that it includes a different package 610B. The package 610B includes a metal submount 630, as well as metal gate and drain leads 622B, 624B. RF transistor amplifier 600B also includes a plastic overmold 660 that at least partially surrounds the RF transistor amplifier die 100, the leads 622B, 624B, and the metal submount 630.

Many variations of the features of the above embodiments are possible. Transistor structures with features that may be used in embodiments of the present invention are disclosed in the following commonly assigned publications, the contents of each of which are fully incorporated by reference herein in their entirety: U.S. Pat. No. 6,849,882 to Chavarkar et al. and entitled "Group-III Nitride Based High Electron Mobility Transistor (HEMT) With Barrier/Spacer Layer"; U.S. Pat. No. 7,230,284 to Parikh et al. and entitled "Insulating Gate AlGaN/GaN HEMT"; U.S. Pat. No. 7,501,669 to Parikh et al. and entitled "Wide Bandgap Transistor Devices With Field Plates"; U.S. Pat. No. 7,126,426 to Mishra et al. and entitled "Cascode Amplifier Structures Including Wide Bandgap Field Effect Transistor With Field Plates"; U.S. Pat. No. 7,550,783 to Wu et al. and entitled "Wide Bandgap HEMTs With Source Connected Field Plates"; U.S. Pat. No. 7,573,078 to Wu et al. and entitled "Wide Bandgap Transistors With Multiple Field Plates"; U.S. Pat. Pub. No. 2005/0253167 to Wu et al. and entitled "Wide Bandgap Field Effect Transistors With Source Connected Field Plates"; U.S. Pat. Pub. No. 2006/0202272 to Wu et al. and entitled "Wide Bandgap Transistors With Gate-Source Field Plates"; U.S. Pat. Pub. No. 2008/0128752 to Wu and entitled "GaN Based HEMTs With Buried Field Plates"; U.S. Pat. Pub. No. 2010/0276698 to Moore et al. and entitled "Gate Electrodes For Millimeter-Wave Operation and Methods of Fabrication; U.S. Pat. Pub. No. 2012/0049973 to Smith, Jr. et al. and entitled "High Power Gallium Nitride Field Effect Transistor Switches"; U.S. Pat. Pub. No. 2012/0194276 to Fisher and entitled "Low Noise Amplifiers Including Group III Nitride Based High Electron Mobility Transistors"; and U.S. Pat. No. 9,847,411 to Sriram et al. entitled "Recessed field plate transistor structures."

Although embodiments of the inventive concepts have been described in considerable detail with reference to certain configurations thereof, other versions are possible. The field plates and gates can also have many different shapes and can be connected to the source contact in many different ways. Accordingly, the spirit and scope of the invention should not be limited to the specific embodiments described above.

What is claimed is:

1. A circuit, comprising:
   a field effect transistor (FET);
   a reference transistor having an output coupled to an output of the FET;
   an active bias circuit coupled to the reference transistor and configured to generate an input signal for the reference transistor in response to a drain current of the reference transistor and to apply the input signal to an input of the reference transistor; and
   a summing node coupled to an input of the FET and to the input of the reference transistor, wherein the summing node adds the input signal to an input signal of the FET.

2. The circuit of claim 1, wherein the FET and the reference transistor each comprise respective source, drain and gate terminals, wherein the drain terminals of the FET and the reference transistor comprise the respective outputs of the FET and the reference transistor, and wherein the drain terminal of the FET is RF-coupled to the drain terminal of the reference transistor through a coupling capacitor.

3. The circuit of claim 2, further comprising:
   an RF shunt capacitor coupled between the gate terminal of the reference transistor and ground.

4. The circuit of claim 2, wherein the gate terminal of the reference transistor is DC coupled to the gate terminal of the FET.

5. The circuit of claim 4, further comprising:
   a buffer coupled between the gate terminal of the reference transistor and the gate terminal of the FET.

6. The circuit of claim 5, wherein the buffer comprises an operational amplifier circuit having a voltage follower configuration.

7. The circuit of claim 4, further comprising:
   a low pass filter coupled between the gate of the reference transistor and the gate of the FET.

8. The circuit of claim 1, further comprising:
   a drain current monitor circuit configured to detect a level of the drain current flowing in the reference transistor, wherein the drain current monitor circuit is coupled to the active bias circuit.

9. The circuit of claim 8, further comprising:
   a low pass filter coupled between the reference transistor and the drain current monitor circuit.

10. The circuit of claim 1, wherein the reference transistor and the FET comprise Group III-nitride based high electron mobility transistors.

11. The circuit of claim 10, wherein the reference circuit and the FET are formed on a single substrate and share a common epitaxial structure.

12. The circuit of claim 1, wherein the reference transistor and the FET are biased with a common drain bias voltage.

13. The circuit of claim 1, wherein the active bias circuit is configured to control a gate voltage of the reference transistor to maintain the drain current at a constant level through the reference transistor.

14. The circuit of claim 1, wherein the active bias circuit is configured to generate the input signal in response to a change in the drain current of the reference transistor, wherein the change in the drain current of the reference transistor is caused by carrier trapping in the reference transistor.

15. A transistor amplifier, comprising:
    a power field effect transistor, FET, having a source terminal, a drain terminal and a gate terminal;
    a reference transistor having a source terminal, a drain terminal and a gate terminal;
    an RF coupling capacitor connected between the drain terminal of the reference transistor and the drain terminal of the power FET;
    a drain current detection circuit coupled to the drain terminal of the reference transistor and configured to detect a change in a drain current of the reference transistor; and
    an active bias circuit coupled to the drain current detection circuit and configured to generate an input signal for the reference transistor in response to the change in the drain current of the reference transistor;
    wherein the input signal is applied to the gate of the reference transistor; and
    wherein the input signal is added to an RF input signal of the power FET.

16. The transistor amplifier of claim 15, wherein the reference transistor and the power FET are biased for Class A operation or a reduced conduction angle bias, such as Class AB operation.

17. The transistor amplifier of claim 15, further comprising:

an RF shunt capacitor coupled between the gate terminal of the reference transistor and ground.

18. The transistor amplifier of claim 15, wherein the gate terminal of the reference transistor is DC coupled to the gate terminal of the power FET.

19. The transistor amplifier of claim 18, further comprising:
a buffer coupled between the gate terminal of the reference transistor and the gate terminal of the power FET.

20. The transistor amplifier of claim 19, wherein the buffer comprises an operational amplifier circuit having a voltage follower configuration.

21. The transistor amplifier of claim 18, further comprising:
a low pass filter coupled between the gate of the reference transistor and the gate of the power FET.

22. The transistor amplifier of claim 15, wherein the power FET and the reference transistor comprise Group III-nitride based high electron mobility transistors.

23. A method of compensating carrier trapping effects in a field effect transistor (FET), the method comprising:
detecting a change in drain current of a reference transistor that is coupled to the FET;
generating an input signal for the reference transistor in response to the change in the drain current of the reference transistor;
applying the input signal to an input of the reference transistor; and
adding the input signal as a compensation signal to an RF input signal of the FET.

24. The method of claim 23, wherein the power FET and the reference transistor comprise Group III-nitride based high electron mobility transistors.

* * * * *